United States Patent [19]

Keenan

[11] Patent Number: 5,161,023

[45] Date of Patent: Nov. 3, 1992

[54] PREVIOUS CHANNEL FEATURE IN A TELEVISION RECEIVER HAVING MULTIPLE RF INPUTS

[75] Inventor: Douglas M. Keenan, Noblesville, Ind.

[73] Assignee: Thomson Consumer Electronics, Inc., Indianapolis, Ind.

[21] Appl. No.: 589,831

[22] Filed: Sep. 24, 1990

[51] Int. Cl.$^5$ .............................................. H04N 5/50
[52] U.S. Cl. .......................... 358/193.1; 358/191.1; 455/160.1; 455/161.1; 455/168.1; 455/185.1
[58] Field of Search ............... 358/191.1, 194.9, 193.1; 455/150, 151, 160, 161, 179, 185, 186, 140, 166, 168, 176

[56] References Cited

U.S. PATENT DOCUMENTS

| | | | |
|---|---|---|---|
| 4,063,179 | 12/1977 | Brown | 455/166 |
| 4,075,567 | 2/1978 | Klank et al. | 455/186 |
| 4,291,413 | 9/1981 | Henderson et al. | 455/185 |
| 4,317,225 | 2/1982 | Henderson et al. | 358/193.1 |
| 4,317,227 | 2/1982 | Skerlos | 455/168 |
| 4,348,771 | 9/1982 | Klank et al. | 455/185 |
| 4,361,907 | 11/1982 | Wine | 455/166 |
| 4,398,303 | 8/1983 | Chin et al. | 455/168 |
| 4,737,993 | 4/1988 | DeVilbiss | 358/191.1 |
| 4,776,038 | 10/1988 | Testin et al. | 358/193.1 |
| 4,841,368 | 6/1989 | Rumbolt et al. | 358/194.1 |
| 4,888,819 | 12/1989 | Oda et al. | 358/191.1 |
| 5,048,119 | 9/1991 | Wassink | 455/186 |

*Primary Examiner*—James J. Groody
*Assistant Examiner*—Jeffrey S. Murrell
*Attorney, Agent, or Firm*—Joseph S. Tripoli; Peter M. Emanuel; Thomas F. Lenihan

[57] ABSTRACT

In a television receiver including a plurality of RF input terminals, each of which having a respective scan list, and each scan list having an associated Last Tuned Channel register, and having a common Current Channel register, there is provided a Previous Channel and RF Input register. The Previous Channel and RF Input register and the Current Channel register both hold tuning information and RF input terminal information which allow retuning of a formerly tuned channel regardless of which RF input provides the signal for that channel. In one embodiment of the invention, the scan lists are linked providing an easy way to scan through the channels of all scan lists, and an easy return to a previously tuned channel from any RF input via operation of a Previous Channel (PC) key.

11 Claims, 6 Drawing Sheets

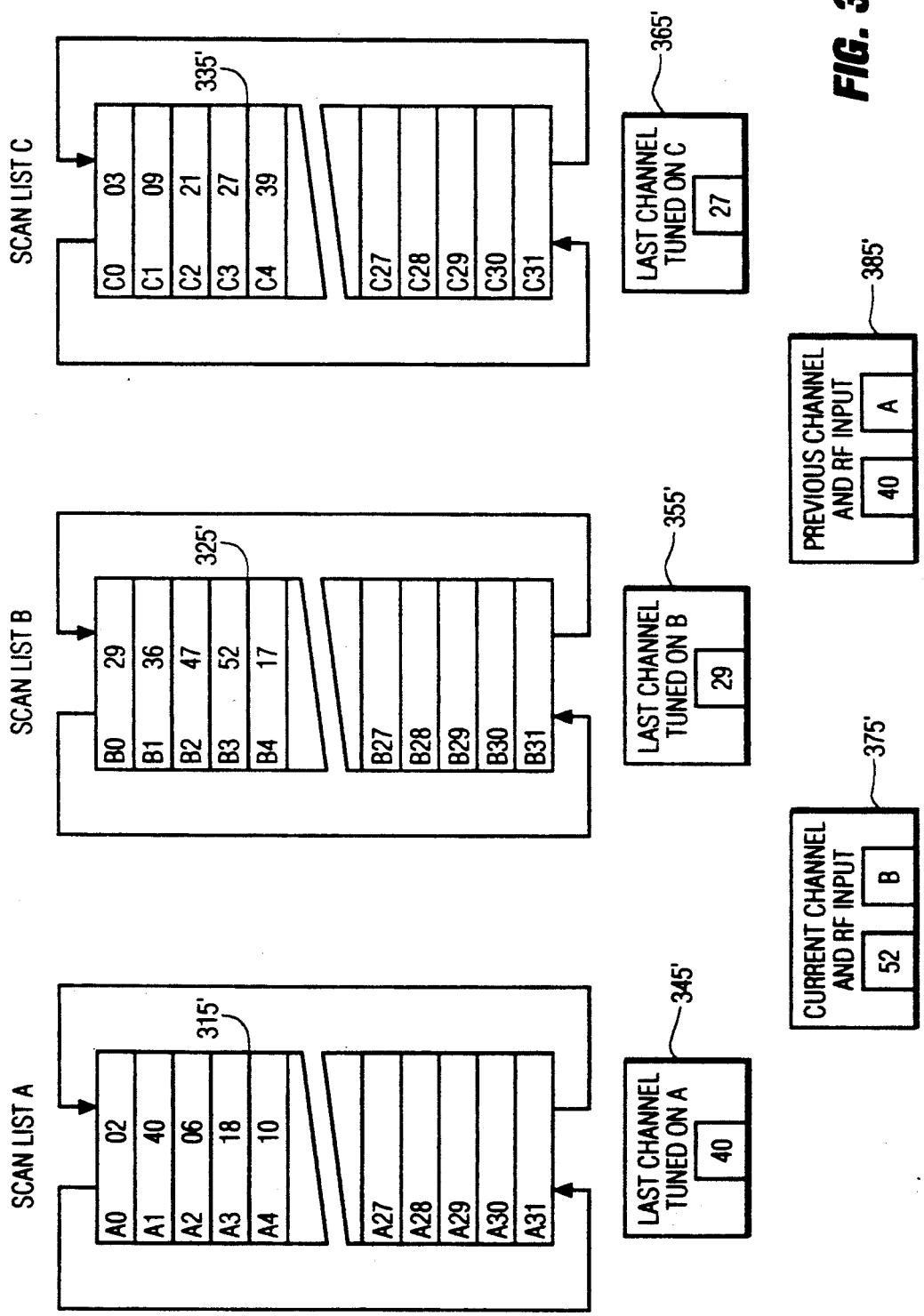

PREVIOUS CHANNEL FEATURE IN A TELEVISION RECEIVER HAVING MULTIPLE RF INPUTS

CROSS REFERENCE TO RELATED APPLICATIONS

The subject application is related to copending U.S. Pat. application bearing Ser. No. 589,830 and 589,832, and assigned to the same assignee as the present invention.

1. Field of the Invention

The subject application concerns the field of television receivers having memory circuitry for storing lists of preferred television channels, and in particular, for storing multiple lists, wherein each list relates to a respective one of a plurality of RF signal sources.

2. Background of the Invention

Numerous radio frequency (RF) signal sources are currently available for supplying television signals to a user's television receiver. These RF signal sources include, an ultra-high frequency (UHF) antenna, a very-high frequency (VHF) antenna, video games, home computers, cable television systems, videocassette recorders, videodisc players, and TVRO (television receive-only) satellite television receivers.

Many modern television receivers are equipped with multiple RF signal input connectors, and have the capability of receiving video signals from two different RF signal sources. A television receiver with two RF signal input terminals eliminates repeated plugging-in and unplugging of cables which would otherwise be necessary when changing from one signal source to another.

Systems which allow a user to enter a list of preferred channels (i.e., a scan list) of those channels which are receivable via an RF input terminal, are known. Such scan lists include information as to whether or not the desired channel is an "AIR" channel or a "CABLE" channel, information concerning the tuning voltage required to tune the channel, and information indicating in which band of frequencies the desired channel resides. With such a system, a user can program into the scan list only those channels which are of interest to him, thereby causing the "skipping" of unused, or undesired channels when changing channels via a "channel up", or "channel down" command. Scanning down beyond the last channel stored in the scan list causes the tuning of the first channel in the scan list. Similarly, scanning up beyond the first channel stored in the scan list causes the tuning of the last channel in the scan list. This method of operation is known as "wrapping around" from top to bottom or, bottom to top. Inclusion of a scan list feature in a television receiver having multiple RF input terminals is known from the RCA CTC-133 color television receiver, manufactured by Thomson Consumer Electronics, Inc., Indianapolis, Ind. In this receiver, each RF input terminal has a separate scan list associated with it.

Each scan list of the above-mentioned CTC-133 television chassis has a "Last Tuned Channel" register associated with it for maintaining a record of the last-tuned channel from its associated RF input terminal. The last-tuned channel information is used to retune the last-tuned channel when a user operates a "previous channel" (PC) key on his remote control unit. It is a characteristic of the above-mentioned CTC-133 television chassis that operation of the PC key will only tune a previous channel from the same RF input terminal as is currently selected, due to the complete independence of the scan lists and last-tuned channel registers.

Copending U.S. patent application Ser. No. 589,830 (Keenan) discloses a system in which the scan lists associated with each RF input terminal are capable of being linked together so that a user may scan through all channels on all scan lists in sequence, with the proper RF input terminal being automatically selected when the system automatically advances from one scan list to another. In such a system, a user may be confused by operation of the PC key according to the CTC-133 system because operation of the PC key of that television receiver will not cause the tuning of a previously tuned channel from an RF input other than the currently selected RF input.

SUMMARY OF THE INVENTION

In a television receiver including a plurality of RF input terminals, each of which having a respective scan list, and each scan list having an associated Last Tuned Channel register, and having a common Current Channel register, there is provided a Previous Channel and RF Input register. The Previous Channel and RF Input register and the Current Channel register both hold tuning information and RF Input terminal information which allow retuning of a formerly tuned channel regardless of which RF input provides the signal for that channel. In one embodiment of the invention, the scan lists are linked providing an easy way to scan through the channels of all scan lists, and an easy return to a previously tuned channel from any RF input via operation of a Previous Channel (PC) key.

BRIEF DESCRIPTION OF THE DRAWING

FIGS. 3B and 4 show arrangements of memory locations for storing scan lists and associated registers, in accordance with the subject invention.

DETAILED DESCRIPTION OF THE EMBODIMENT

Figure 1:
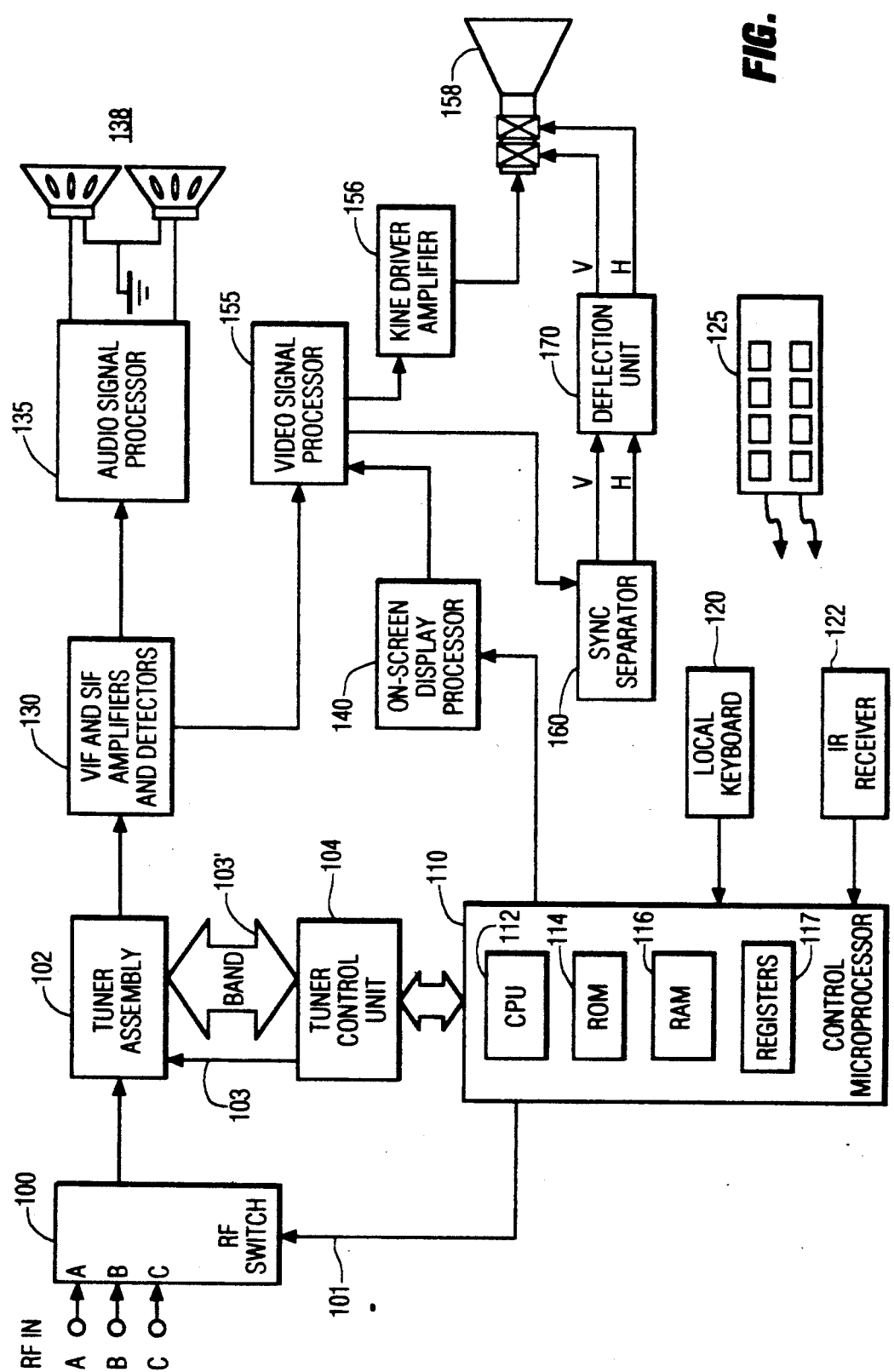
FIG. 1 shows, in block diagram form, a television receiver incorporating the subject invention.

Referring to FIG. 1, radio frequency (RF) signals are applied to RF input terminals A, B, and C of RF switch 100. Under control of a control signal applied via wire 101, RF switch 100 selects one of inputs A, B, and C to supply one or more RF signals to a tuner assembly 102. Tuner assembly 102 selects a particular RF signal under control of a tuner control unit 104 which applies a tuning control signal to tuner assembly 102 via a wire 103, and applies bandswitching signals via a control bus 103'. Tuner control unit 104 is controlled by a controller 110. Controller 110, which may be a microprocessor or microcomputer, includes a central processing unit (CPU) 112, a read-only memory (ROM) 114, and a random access memory 116. Controller 110 generates the above-mentioned control signal for RF switch 100 for selecting an RF input for tuner 102. Controller 110 receives user-entered control signals from a local keyboard 120 and from an infrared (IR) receiver 122. IR receiver 122 receives and decodes remote control signals transmitted by a remote control unit 125.

Tuner 102 produces a signal at an intermediate frequency (IF) and applies it to a processing unit 130 comprising a video IF (VIF) amplifying stage, an AFT circuit, a video detector, and a sound IF (SIF) amplifying stage. Processing unit 130 produces a baseband composite video signal (TV), and a sound carrier signal. The sound carrier signal is applied to an audio signal processor unit 135 which includes an audio detector and a stereo decoder. Audio signal processor unit 135 produces baseband left and right audio signals and applies them a pair of speakers 138 for sound reproduction.

The baseband video signal (TV) is coupled to a video processor unit 155 and a kine driver amplifier 156, and ultimately displayed on a display screen of a display device 158. Video signals are also applied to a sync separator unit 160 which derives vertical and horizontal synchronizing signals therefrom. The derived vertical and horizontal signals are applied to a deflection unit 170 for the production of deflection signals for application to the yoke assembly of display device 158. Under control of controller 110, an on-screen display processor 140 generates character signals, and applies them to a second input of video signal processor 155, for display on display device 158. The circuitry described thus far is known from the above-mentioned RCA CTC-133 color television chassis.

Figure 2:
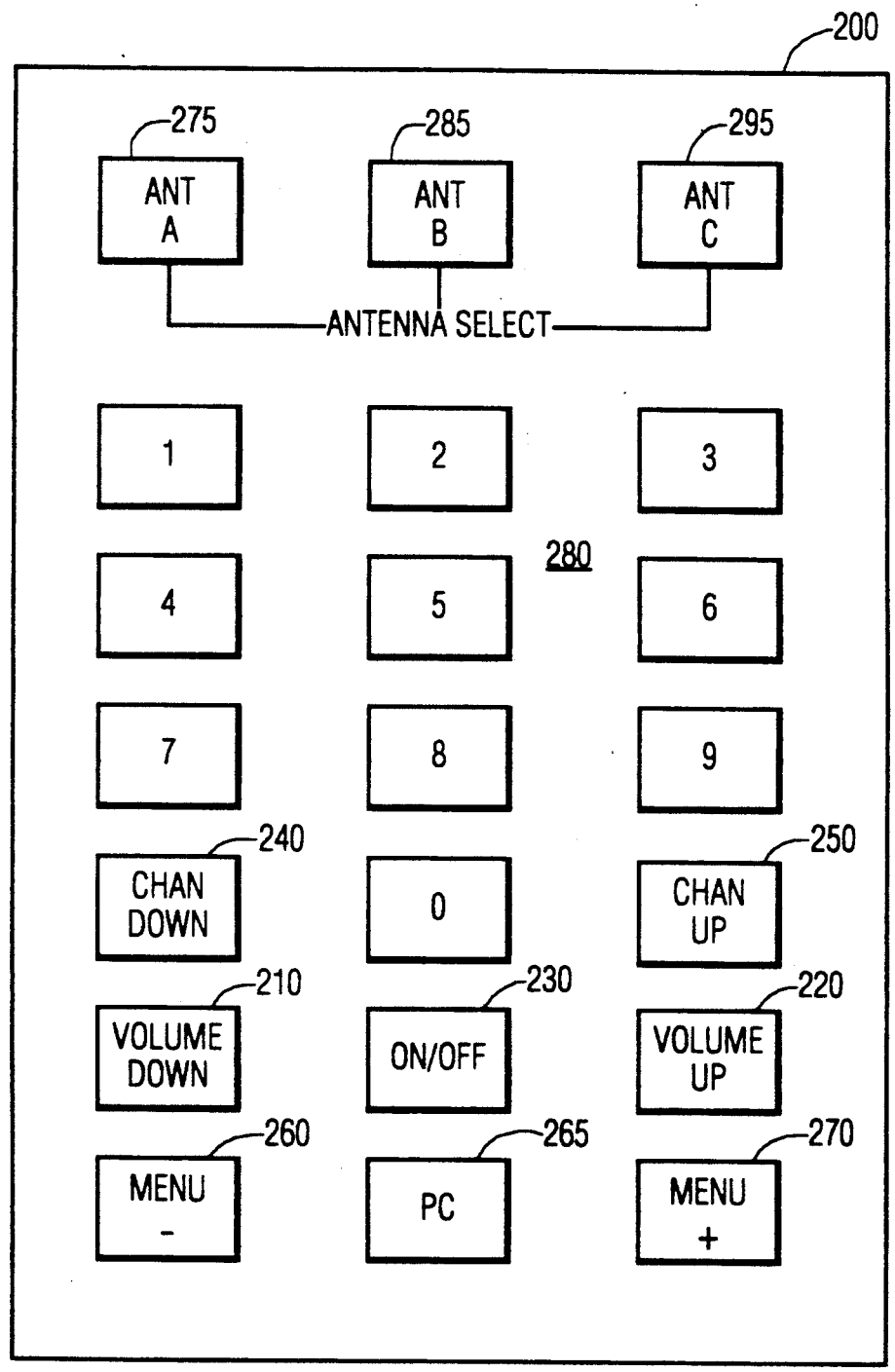
FIG. 2 shows a keyboard suitable for use with the remote control handunit of FIG. 1.

Turning to FIG. 2, a keyboard 200 suitable for use on remote control unit 125 of FIG. 1, includes a VOLUME DOWN key 210, a VOLUME UP key 220, an ON/OFF key 230, a CHANNEL DOWN key 240, a CHANNEL UP key 250, a Previous Channel (PC) key 265, a MENU−key 260, a MENU+key 270, an array of numbered keys generally designated 280, and a group of ANTENNA SELECT keys 275, 285, and 295. Specific use of keys of keyboard 200 will be described in detail below.

Figure 3A:
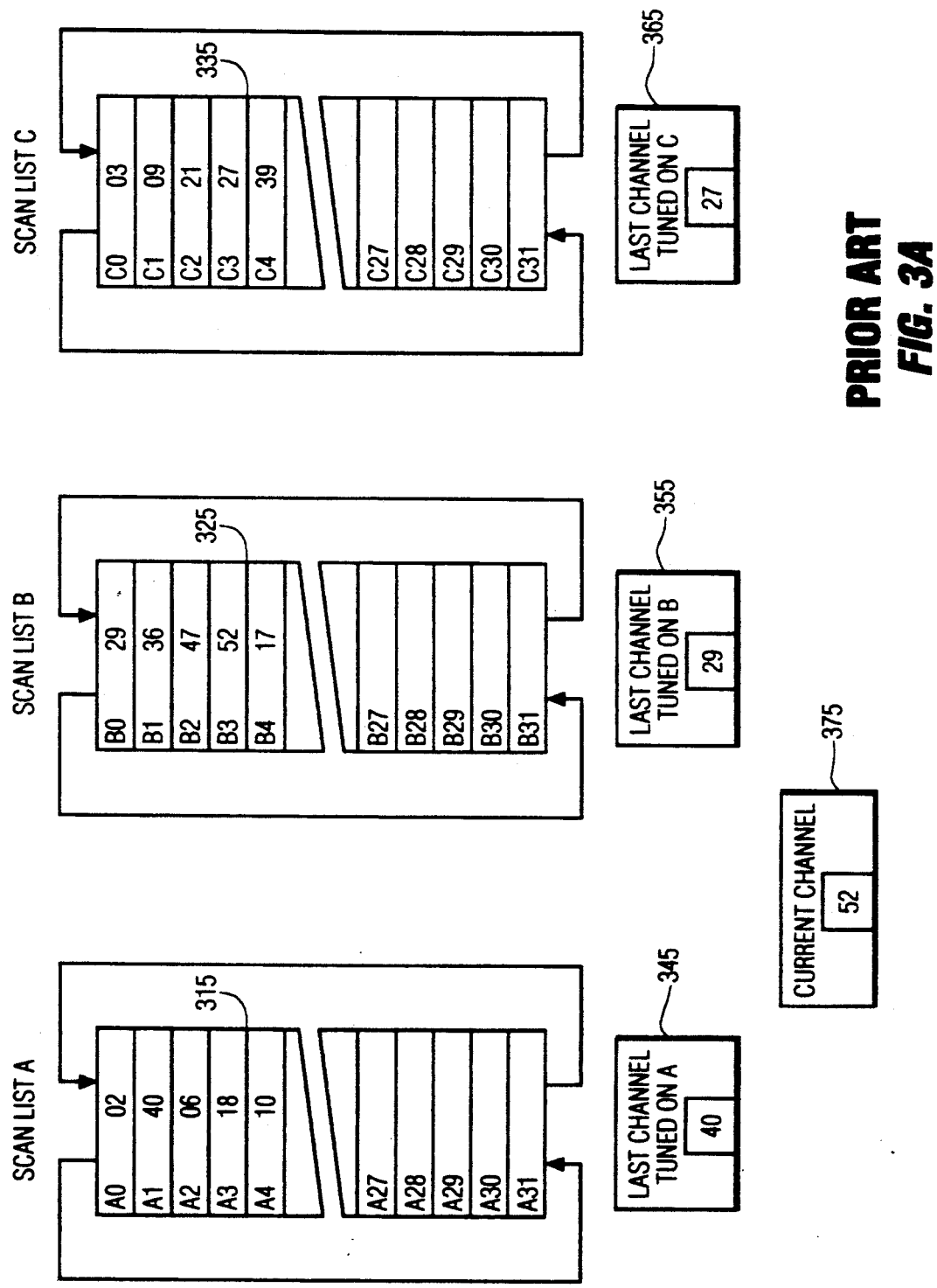
FIG. 3A shows an arrangement of memory locations for storing scan lists and associated registers, as known from the prior art.

As noted above, the RCA CTC-133 color television chassis includes three RF input connectors, each having a respective scan list associated with it. For purposes of explanation, these scan lists can be thought of as being arranged in memory (i.e., RAM 116) as shown in FIG. 3A. Each scan list is independent of the others. Each scan list has its own pointer, which upon reaching the bottom of the scan list while scanning down, "wraps around" to the top, and which upon reaching the top of the scan list while scanning up, "wraps around" to the bottom. For simplicity, scan lists 315, 325, and 335 are shown as including 32 (i.e., A0-A31) memory locations each. Also for simplicity, the "wrap around" arrows are shown extending between locations A0 and A31. In fact, a scan list having only three locations filled would "wrap around" between location A2 (i.e., the third location in the list) and location A0. That is, the logical end of the scan list is not necessarily the same memory location as the physical end of the scan list. Note that in the prior art system of FIG. 3A, a user must first select the scan list containing the desired channel information, and then conduct a search for the desired channel. A problem occurs in this system when the user cannot remember which scan list is the proper one to select for searching.

Figure 4:
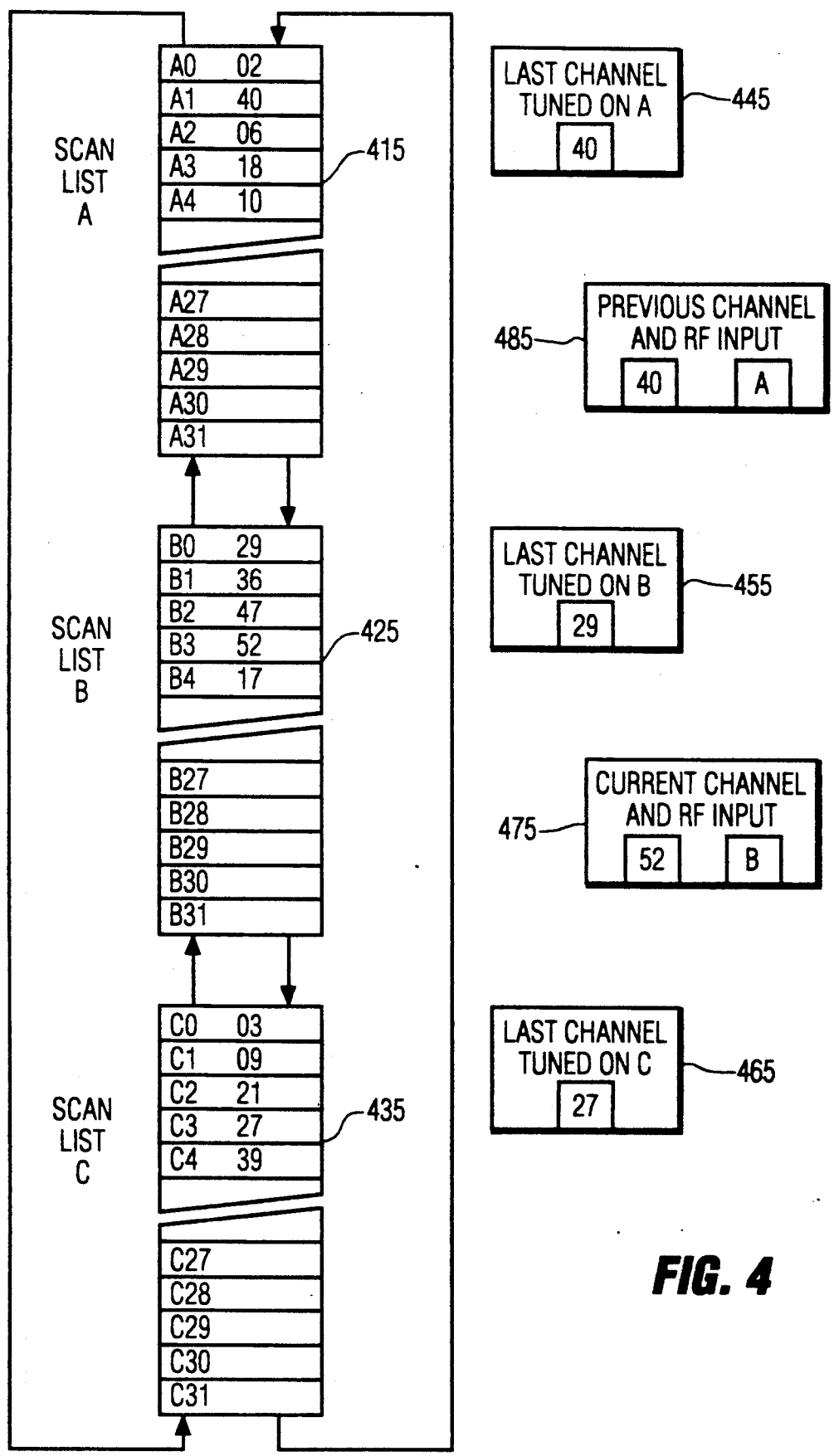

The scan lists of the present invention can be arranged as shown in FIG. 3B, or rearranged as shown in FIG. 4, by means of a user-entered command. Each scan list of FIG. 4 is linked with the others. The linked scan list has its own pointer, which upon reaching the bottom of the linked scan list while scanning down, "wraps around" to the top, and which upon reaching the top of the linked scan list while scanning up, "wraps around" to the bottom. As noted above, for simplicity, scan lists 415, 425, and 435 are shown as including 32 (i.e., A0-A31) memory locations each. Also for simplicity, the "wrap around" arrows are shown extending between locations A0 and A31. As was true in FIG. 3A, a scan list having only three locations filled would "wrap around" between location A2 (i.e., the third location in the list) and location A0. That is, the logical end of the scan list is not necessarily the same memory location as the scan list is not necessarily the same memory location as the physical end of the scan list. Note that unlike the prior art system of FIG. 3A, a user can scan through all three lists in sequence automatically to find a desired channel. Note that the act of switching from one list to another also causes the selection of a new RF input connector, because each scan list, even though linked, remains associated with a respective RF input connector. Similarly, the act of selecting a new RF input terminal by pressing one of ANTENNA SELECT keys 275, 285 or 295, also selects the appropriate scan list for that RF terminal.

Prior art FIG. 3A, also shows a LAST CHANNEL TUNED ON A register 345, a LAST CHANNEL TUNED ON B register 355, a LAST CHANNEL TUNED ON C register 365, and a CURRENT CHANNEL register 375. The act of selecting a new RF input terminal by pressing one of ANTENNA SELECT keys 275, 285 or 295, causes the tuning of the last tuned channel from that antenna, which channel number is contained in the appropriate LAST TUNED CHANNEL register. For example, if antenna B is currently selected and channel 52 is currently tuned, the pressing of ANTENNA SELECT key 295 will cause the selection of RF input terminal C, and the tuning of channel 27, which was the last tuned channel number on RF input terminal C, as shown in register 365. However, if PC key 265 is then pressed, the system will not retune channel 52 because previously selected RF input terminal information is not stored in any of the registers. This is due to the fact that the scan lists for each input terminal are completely independent of one another, and operation of the PC key is a "local" function (operating within a single scan list), rather than a "global" function (operating across all scan lists). In such an arrangement, operation of the PC key causes the exchange (i.e., swap) of the information contained in the CURRENT CHANNEL and the appropriate LAST CHANNEL TUNED registers.

FIG. 3B shows an unlinked arrangement of scan lists similar to the arrangement of prior art FIG. 3A. All elements of FIG. 3B having similar reference numerals to elements of FIG. 3A serve similar purposes. Note that register 375' of FIG. 3B contains not only current channel information, but also current RF input terminal information. Note also the addition of a PREVIOUS CHANNEL AND RF INPUT register 385'. FIG. 3B shows that the current channel tuned is channel 52 from RF input B, and that the previous channel tuned was channel 40 from RF input A. In this system, operation of the PC key will cause the retuning of the previous channel regardless of which RF input terminal was previously selected, because all the information necessary for retuning the previous channel from any RF input is stored in register 385'.

FIG. 4 illustrates the invention in cooperation with a linked scan list arrangement wherein similarly numbered elements of FIGS. 3B and 4 serve the same purpose. In an arrangement according to FIG. 4, a user may scan through the channels of all scan lists in sequence, and return to the previous channel via operation of the PC key, as follows. Assume that the television receiver is tuned to channel 40 on RF input A. If the user presses CHANNEL UP (CHAN UP) key 250 of keyboard 200 and holds that key depressed, then the television receiver will tune each channel of scan list A, then automatically advance to scan list B, select RF input terminal B, and begin tuning each of the channels of scan list B. If CHAN UP key 250 is released when channel 52 is tuned, then the registers will contain the data as shown in FIG. 4. Note that the channels tuned between channel 40 on scan list A and channel 52 on scan list B have no effect on the data in PREVIOUS CHANNEL AND RF INPUT register 485, because PREVIOUS CHANNEL AND RF INPUT register 485 is not updated until the CHAN up or CHAN DOWN key is released. Therefore, the channel tuned just before beginning an extended pressing of CHAN UP key 250, or CHAN DOWN key 240, can be retuned by use of PC key 265. Alternatively, if the user happened to remember that the channel he had been watching (i.e. channel 40) was from RF input A, then he could retune it by selecting RF input A with ANTENNA SELECT key 275, which would cause tuning in accordance with the data stored in LAST CHANNEL TUNED ON A register 445. LAST CHANNEL TUNED ON A register 445 contains the correct data because it is not updated until CHAN UP key 250 or CHAN DOWN key 240 is released, and unless the currently tuned channel is from RF input A.

Figure 5:
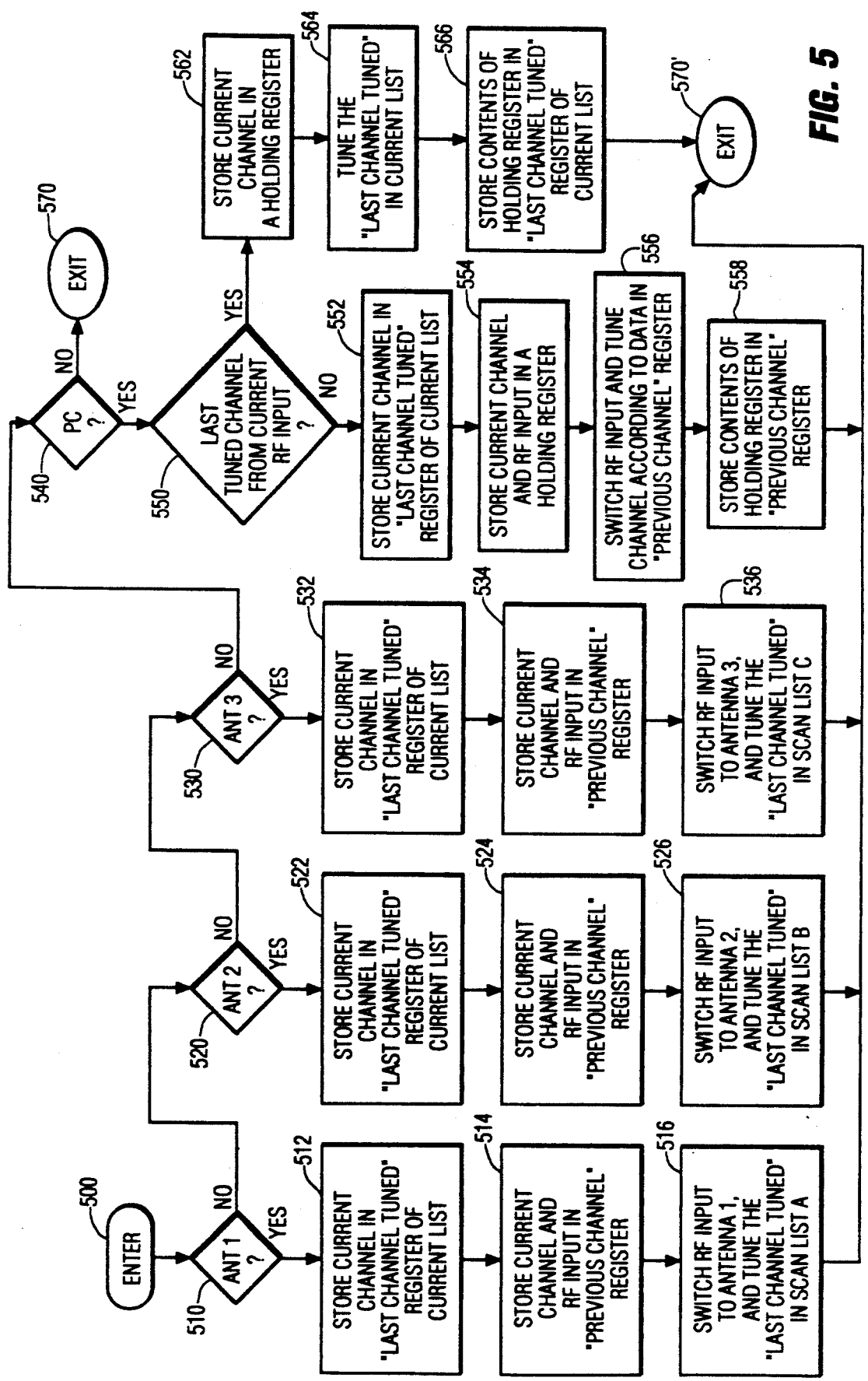
FIG. 5 is a flowchart showing a portion of the control program of the controller of FIG. 1.

A portion of the control program for controller 110, for controlling antenna (RF input) selection and channel tuning via Antenna key or PC key operation, is illustrated in the flowchart of FIG. 5. For purposes of this explanation, it is assumed that the desired channel information has previously been programmed into the scan lists, in the usual manner. The program is entered at step 500 upon reception of a keyboard, or remote control, ANT 1, ANT 2, ANT 3, or PC command. At step 510, a decision is made as to whether or not the received command is an ANT 1 command. If the command is an ANT 1 command, then the program stores the current channel information in the LAST CHANNEL TUNED register of the currently-accessed scan list (step 512). The current channel data and RF input data is stored in PREVIOUS CHANNEL register 485 (step 514). RF input switch 100 is controlled to select Antenna A, and tuner 102 is controlled to tune in accordance with the data stored in the LAST CHANNEL TUNED ON A register (step 516). The routine is then exited via exit block 570'. If the received command was not ANT 1, then a check is made to see if the received command is ANT 2 (step 520). If yes, then steps 522, 524, and 526 are executed. Steps 522, 524, and 526 are similar to steps 512, 514, and 516, and need not be described in detail. If the received command was not ANT 2, then a check is made to see if the received command is ANT 3 (step 530). If yes, then steps 532, 534, and 536 are executed. Steps 532, 534, and 536 are also similar to steps 512, 514, and 516, and need not be described in detail. If the received command was not ANT 3, then a check is made to see if the received command is the previous channel PC command (step 540). If not, then the routine is exited at exit block 570. If the received command is PC, then a check is made as to whether or not the last channel tuned is from the currently selected RF input (step 550). If not, the NO path is followed to step 552 in which the data relating to the currently tuned channel is stored in the LAST CHANNEL TUNED register of the currently accessed scan list. The program then advances to steps 554, 556, and 558 wherein the contents of CURRENT CHANNEL AND RF INPUT register 375' or 475 is swapped with the contents of PREVIOUS CHANNEL AND RF INPUT register 385' or 485, the previous RF input selected, and the previous channel tuned. The program is then exited at exit block 570'. However, if the LAST TUNED CHANNEL is from the currently selected RF input terminal, then the YES path is taken from step 550 to steps 562, 564, and 566 wherein the contents of CURRENT CHANNEL AND RF INPUT register 375' or 475 is swapped with the contents of the appropriate LAST CHANNEL TUNED register 345', 355', 365', or 445, 455, or 465, and the previous channel tuned. The program is then exited at exit block 570'.

The term television receiver, as used herein, includes television receivers having a display device (commonly known as television sets) and television receivers without a display device, such as VCRs.

What is claimed is:

1. A television receiver, comprising:
   a plurality of radio frequency (RF) signal input terminals, each of which receives a group of RF signals from respective RF signal sources;
   RF switch means having a plurality of inputs, each of which is connected to a respective one of said RF input terminals, said RF switch means having an output at which is developed one of said groups of RF signals selected from said groups of RF signals at said inputs, said RF switch means having a control input for receiving a first control signal for selecting said selected group of RF signals;
   tuner means coupled to said RF switch means for receiving said selected group of RF signal, said tuner means selecting a particular RF signal from said selected group of RF signals in response to a second control signal, and converting said particular RF signal to a signal at an intermediate frequency (IF);
   control means for generating said first and second control signals for causing said RF switch means to select said selected group of RF signals and for causing said tuner means to select said particular RF signal;
   means, coupled to said control means, for entering data in response to operation by a user;
   first means for storing data related to the tuning of a currently tuned one of said RF signals, and related to a currently selected one of said RF input terminals;
   second means for storing data related to the tuning of that one of said RF signals which was most previously tuned, and related to that one of said RF input terminals which was most previously selected;
   wherein said means for entering data comprises keys for selecting individual ones of said RF input terminals and a key (PC) for causing the selection of said most previously tuned RF signal, and operation of said PC key causes the tuning of said most previously selected RF signal and the selection of said most previously selected RF input terminal.

2. A television receiver, comprising:

a plurality of radio frequency (RF) signal input terminals, each of which receives a group of RF signals from respective RF signal sources;

RF switch means having a plurality of inputs, each of which is connected to a respective one of said RF input terminals, said RF switch means having an output at which is developed one of said groups of RF signals selected from said RF signals at said inputs, said RF switch means having a control input for receiving a first control signal for selecting said selected group of RF signals;

tuner means coupled to said RF switch means for receiving said selected group of RF signals, said tuner means selecting a particular RF signal from said group of RF signals in response to a second control signal, and converting said particular RF signal to a signal at an intermediate frequency (IF);

control means for generating said first and second control signals for causing said RF switch means and said tuner means to select said particular RF signal;

means, coupled to said control means, for entering data in response to operation by a user;

first means for storing data related to the tuning of the currently tuned one of said RF signals, and related to the currently selected one of said RF input terminals;

second means for storing data related to the tuning of the previously tuned one of said RF signals, and related to the previously selected one of said RF input terminals;

wherein in response to said data entered by said user, said control means retrieves said tuning data and said RF input terminal data from said second means for tuning said previously tuned RF signal by generating said second control signal and for selecting said previously selected RF input terminal by generating said first control signal, said control means interchanging said data in said first and second means for storing data; and wherein said means for entering data comprises a remote control unit, said remote control unit including keys for selecting individual ones of said RF input terminals and a key (PC) for causing the selection of said previously selected RF signal, wherein operation of said PC key causes the tuning of said previously selected RF signal and the selection of said previously selected RF input terminal.

3. The television receiver of claim 2, further including third, fourth, and fifth means for storing data, each of which stores data relating to the last channel tuned from a respective one of said RF input terminals, wherein operation of one of said keys for selecting individual ones of said RF input terminals causes the tuning of an RF signal in accordance with data contained in a respective one of said third, fourth, and fifth means for storing data.

4. The television receiver of claim 3 wherein operation of said PC key causes the tuning of the last RF signal tuned, regardless of which RF input terminal provided said last RF signal, and regardless of the RF input terminal selected when said PC key is operated.

5. A television receiver, comprising:

a plurality of radio frequency (RF) signal input terminals, each of which receives a group of RF signals from respective RF signal sources;

RF switch means having a plurality of inputs, each of which is connected to a respective one of said RF input terminals, said RF switch means having an output at which is developed one of said groups of RF signals selected from said groups of RF signals at said inputs, said RF switch means having a control input for receiving a first control signal for selecting said selected group of RF signals;

tuner means coupled to said RF switch means for receiving said selected group of RF signals, said tuner means selecting a particular RF signal from said group of RF signals in response to a second control signal, and converting said particular RF signal to a signal at an intermediate frequency (IF);

control means for generating said first and second control signals for causing said RF switch means to select said selected group of RF signals, and for causing said tuner means to select said particular RF signal;

means, coupled to said control means, for entering data in response to operation by a user, said data entry means including a Channel Up key, a Channel Down key and a Previous Channel (PC) key;

first means for storing data related to the tuning of a currently tuned one of said RF signals, and related to a currently selected one of said RF input terminals;

second means for storing data related to the tuning of the most previously tuned one of said RF signals, and related to the most previously selected one of said RF input terminals;

memory means having a plurality of areas for storing data related to the tuning of ones of said RF signals which are preferred by a user, each of said areas storing tuning information specific to the RF signals of a respective one of said groups of RF signals received at one of said RF input terminals, each of said areas including a plurality of memory locations between first and second limits;

wherein in response to one of a Channel Up and a Channel Down command entered by said user, said control means sequentially retrieves said tuning data from said memory means in one of a linked mode in which said control means automatically retrieves said tuning data beginning at said first limit of a second one of said areas after having retrieved said tuning data from said memory location at said second limit of said first area, and an unlinked mode in which said control means automatically begins the sequential retrieval of said tuning data from said memory location at said first limit of said first area upon retrieving said tuning data from said memory location at said second limit of said first area, said control means automatically generating said first control signal for selecting the respective one of said RF input terminals which is related to the memory area from which said tuning data is to be retrieved;

wherein in response to operation of said PC key by said user, said control means retrieves said tuning data and said RF input terminal data from said second means for tuning said most previously tuned RF signal by generating said second control signal and for selecting said most previously selected RF input terminal by generating said first control signal; and wherein operation of said PC key causes the tuning of the last RF signal tuned, regardless of which RF input terminal provided said last RF signal, and regardless of the RF input terminal selected when said PC key is operated.

6. The television receiver of claim 5, wherein operation of said one of said Channel Up key and said Channel Down key of said means for entering data causes sequential tuning of said RF signals in accordance with said data stored in said memory means, said one of said Channel Up key and said Channel Down key causing the tuning of RF signals sequentially and repetitively when operated and until released, said data being stored in said second means for storing data related to the tuning of said most previously tuned one of said RF signals, and related to said most previously selected one of said RF input terminals when said one of said Channel Up key and said Channel Down key is released.

7. A television receiver, comprising:

a plurality of radio frequency (RF) signal input terminals, each of which receives a group of RF signals from respective RF signal sources;

RF switch means having a plurality of inputs, each of which is connected to a respective one of said RF input terminals, said RF switch means having an output at which is developed one of said groups of RF signals selected from said groups of RF signals at said inputs, said RF switch means having a control input for receiving a first control signal for selecting said selected group of RF signals;

tuner means coupled to said RF switch means for receiving said selected group of RF signals, said tuner means selecting a particular RF signal from said group of RF signals in response to a second control signal, and converting said particular RF signal to a signal at an intermediate frequency (IF);

control means for generating said first and second control signals for causing said RF switch means to select said selected group of RF signals and causing said tuner means to select said particular RF signal;

means, coupled to said control means, for entering data in response to operation by a user;

first means for storing data related to the tuning of a currently tuned one of said RF signals, and related to a currently selected one of said RF input terminals;

second means for storing data related to the tuning of the most previously tuned one of said RF signals, and related to the most previously selected one of said RF input terminals;

memory means having a plurality of areas for storing data related to the tuning of ones of said RF signals which are preferred by a user, each of said areas storing tuning information specific to the RF signals of a respective one of said groups of RF signals received at one of said RF input terminals, each of said area including a plurality of memory locations between first and second limits;

wherein in response to said data entered by said user, said control means sequentially retrieves said tuning data from said memory means in one of a linked mode in which said control means automatically retrieves said tuning data beginning at said first limit of a second one of said areas after having retrieved said tuning data from said memory location at said second limit of said first area, and an unlinked mode in which said control means automatically begins the sequential retrieval of said tuning data from said memory location at said first limit of said first area upon retrieving said tuning data from said memory location at said second limit of said first area, said control means automatically generating said first control signal for selecting the respective one of said RF input terminals which is related to the memory area from which said tuning data is to be retrieved; and wherein in response to said data entered by said user, said control means retrieves said tuning data and said RF input terminal data from said second means for tuning said most previously tuned RF signal by generating said second control signal and for selecting said most previously selected RF input terminal by generating said first control signal, said control means interchanging said data in said first and second means for storing data;

wherein said means for entering data comprises a keyboard including a key for sequentially tuning said RF signals in accordance with said data stored in said memory means, said key for sequentially tuning said RF signals causing the tuning of RF signals sequentially and repetitively when operated and until released, said data being stored in said second means for storing data related to the tuning of the previously tuned one of said RF signals, and related to the previously selected one of said RF input terminals when said key for sequentially tuning said RF signals is released; and wherein said means for entering data comprises a remote control unit, said remote control unit including keys for selecting individual ones of said RF input terminals and a key (PC) for causing the selection of said previously selected RF signal, wherein operation of said PC key causes the tuning of said previously selected RF signal and the selection of said previously selected RF input terminal.

8. The television receiver of claim 7, further including third, fourth, and fifth means for storing data, each of which stores data relating to the last channel tuned from a respective one of said RF input terminals, wherein operation of one of said keys for selecting individual ones of said RF input terminals causes the tuning of an RF signal in accordance with data contained in a respective one of said third, fourth, and fifth means for storing data.

9. The television receiver of claim 8 wherein operation of said PC key causes the tuning of the last RF signal tuned, regardless of which RF input terminal provided said last RF signal, and regardless of the RF input terminal selected when said PC key is operated.

10. A television receiver, comprising:

a plurality of radio frequency (RF) signal input terminals, each of which receives a group of RF signals from respective RF signal sources;

RF switch means having a plurality of inputs, each of which is connected to a respective one of said RF input terminals, said RF switch means having an output at which is developed a selected one of said groups of RF signals, said RF switch means having a control input for receiving a first control signal for selecting said selected one of said groups of RF signals;

tuner means coupled to said RF switch means for receiving said selected group of RF signals, said tuner means selecting a particular RF signal from said group of RF signals in response to a second control signal;

control means for generating said first and second control signals for causing said RF switch means to select an appropriate one of said groups of said RF signals and for causing said tuner means to select said particular RF signal;

means, coupled to said control means, for entering data in response to operation by a user;

memory means having a plurality of areas for storing data related to the tuning of ones of said RF signals which are preferred by a user, each of said areas storing tuning information specific to the RF signals of a respective one of said groups of RF signals received at one of said RF input terminals, said memory means being coupled to said control means;

current channel data storage means for storing data related to the tuning of a currently tuned one of said RF signals, and related to a currently selected one of said RF input terminals, said current channel data storage means being coupled to said control means;

previous channel data storage means for storing data related to the tuning of that one of said RF signals which was most previously tuned, and related to that one of said RF input terminals which was most previously selected, said previous channel data storage means being coupled to said control means;

third and fourth means for storing data, each of which stores data relating to the last channel tuned from a respective one of said RF input terminals, wherein operation of one of said keys for selecting individual ones of said RF input terminals causes the tuning of an RF signal in accordance with data contained in a respective one of said third, and fourth means for storing data, said third and fourth means for storing data being coupled to said control means;

wherein in response to said data entered by said user, said control means sequentially retrieves said tuning data from said memory means in one of a linked mode in which said control means automatically retrieves said tuning data from a second one of said areas after having completed the sequential retrieval of said tuning data from a first area, and an unlinked mode in which said control means automatically begins the sequential retrieval of said tuning data from said first area upon completion of said sequential retrieval of said tuning data from said first area;

said control means automatically generating said first control signal for selecting the respective one of said RF input terminals which is related to the memory area from which said tuning data is to be retrieved;

said control means selecting said linked and unlinked modes in response to data entered by said user; and said means for entering data comprises keys for selecting individual ones of said RF input terminals and a key (PC) for causing the selection of said most previously tuned RF signal, wherein in said linked mode operation of said PC key causes the tuning of said most previously selected RF signal and the selection of said most previously selected RF input terminal, and wherein in said unlinked mode operation of said PC key causes the tuning of said most previously selected RF signal from data stored in the one of said third and fourth memory areas associated with said currently selected RF input terminal.

11. A television receiver, comprising:

a plurality of radio frequency (RF) signal input terminals, each of which receives a group of RF signals from respective RF signal sources;

RF switch means having a plurality of inputs, each of which is connected to a respective one of said RF input terminals, said RF switch means having an output at which is developed a selected one of said groups of RF signals, said RF switch means having a control input for receiving a first control signal for selecting said selected one of said groups of RF signals;

tuner means coupled to said RF switch means for receiving said selected group of RF signals, said tuner means selecting a particular RF signal from said group of RF signals in response to a second control signal;

control means for generating said first and second control signals for causing said RF switch means to select an appropriate one of said groups of said RF signals and for causing said tuner means to select said particular RF signal;

means, coupled to said control means, for entering data in response to operation by a user;

memory means having a plurality of areas for storing data related to the tuning of ones of said RF signals which are preferred by a user, each of said areas storing tuning information specific to the RF signals of a respective one of said groups of RF signals received at one of said RF input terminals, each of said areas including a plurality of memory locations between first and second limits, said memory means being coupled to said control means;

wherein in response to said data entered by said user, said control means sequentially retrieves said tuning data from said memory means in one of a linked mode in which said control means automatically and sequentially retrieves said tuning data beginning at said first limit of a second one of said areas after having retrieved said tuning data from said memory location at said second limit of a first area, and an unlinked mode in which said control means automatically begins the sequential retrieval of said tuning data from said memory location at said first limit of said first area upon retrieving said tuning data from said memory location at said second limit of said first area, said control means automatically generating said first control signal for selecting the respective one of said RF input terminals which is related to the memory area from which said tuning data is to be retrieved;

said control means selecting said linked and unlinked modes in response to data entered by said user;

current channel data storage means for storing data related to the tuning of a currently tuned one of said RF signals, and data related to a currently selected one of said RF input terminals, said current channel data storage means being coupled to said control means;

previous channel data storage means for storing data related to the tuning of that one of said RF signals which was most previously tuned, and data related to that one of said RF input terminals which was most previously selected, said previous channel data storage means being coupled to said control means;

third and fourth means for storing data, each of which stores data relating to the last channel tuned from a respective one of said RF input terminals, wherein operation of one of said keys for selecting individual ones of said RF input terminals causes the tuning of an RF signal in accordance with data contained in a respective one of said third, and fourth means for storing data, said third and fourth means for storing data being coupled to said control means; and wherein said means for entering data comprises keys for selecting individual ones of said RF input terminals and a key (PC) for causing the selection of said most previously tuned RF signal, wherein in said linked mode operation of said PC key causes the tuning of said most previously selected RF signal and the selection of said most previously selected RF input terminal, and wherein in said unlinked mode operation of said PC key causes the tuning of said most previously selected RF signal from data stored in the one of said third and fourth memory areas associated with said currently selected RF input terminal.

* * * * *